United States Patent
Lee

(10) Patent No.: US 9,209,169 B1
(45) Date of Patent: Dec. 8, 2015

(54) SEMICONDUCTOR DEVICE

(71) Applicant: Vanguard International Semiconductor Corporation, Hsinchu (TW)

(72) Inventor: Tsung-Hsiung Lee, Taoyuan (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 14/449,381

(22) Filed: Aug. 1, 2014

(51) Int. Cl.
*H01L 29/78* (2006.01)
*H01L 27/02* (2006.01)
*H01L 29/739* (2006.01)

(52) U.S. Cl.
CPC ........ *H01L 27/0255* (2013.01); *H01L 27/0262* (2013.01); *H01L 27/0266* (2013.01); *H01L 29/7393* (2013.01); *H01L 29/7817* (2013.01)

(58) Field of Classification Search
CPC ............ H01L 29/7835; H01L 29/7816; H01L 29/0653; H01L 27/0266; H01L 29/0847; H01L 29/7436; H01L 27/027; H01L 29/1095; H01L 29/0692; H01L 27/0259; H01L 29/0696; H01L 2224/48091; H01L 29/66681
See application file for complete search history.

(56) References Cited

U.S. PATENT DOCUMENTS 7,067,852 B1 * 6/2006 Vashchenko et al. ......... 257/173
2006/0186467 A1 * 8/2006 Pendharkar et al. .......... 257/337

* cited by examiner

*Primary Examiner* — Roy Potter
*Assistant Examiner* — Paul Patton
(74) *Attorney, Agent, or Firm* — Birch, Stewart, Kolasch & Birch, LLP

(57) ABSTRACT

A semiconductor device includes: a semiconductor layer having an active region defined thereover, wherein the active region comprises a first sub-region and a second sub-region; a first doped region disposed in a portion of the semiconductor layer, extending across the first sub-region and the second sub-region; a high-voltage (HV) semiconductor element disposed over the semiconductor layer in the first sub-region, wherein the HV semiconductor element comprises a portion of the first doped region formed in the semiconductor layer in the first-sub region of the active region; and an electrostatic discharge (ESD) protection element disposed over the semiconductor layer in the second sub-region, wherein the ESD protection element comprises the other portion of the doped region formed in the semiconductor layer in the second sub-region of the active region.

12 Claims, 7 Drawing Sheets

SEMICONDUCTOR DEVICE

BACKGROUND OF THE INVENTION

1. Field of the Invention

The present invention relates to integrated circuit (IC) devices, and particularly to a semiconductor device suitable for application in a high-voltage operation, including a high-voltage semiconductor element and an electrostatic discharge (ESD) protection element integrated therein.

2. Description of the Related Art

Recently, as demand increases for flat-panel displays, illumination devices, stabilizers, power supplies, and similar products, there has been an increasing interest in research for the high-voltage devices (HV devices) used therein.

Improving semiconductor device reliability has become technically challenging, due to the demand for smaller dimensions and increased functionality of consumer products. High-voltage Semiconductor devices, however, may suffer from electrostatic discharge (ESD) damage when fabricated, assembled, delivered, tested or applied. Thus, ESD protection technology is required for semiconductor devices to protect against possible ESD damage and ensure quality.

Therefore, a reliable high-voltage (HV) semiconductor device with an ESD protection element is needed to meet ESD protection requirements in flat-panel displays, illumination devices, stabilizers, power supplies, and similar products and improve the reliablity of the HV semiconductor device and the lifespan of the products using the HV semiconductor device.

BRIEF SUMMARY OF THE INVENTION

An exemplary semiconductor device comprises a semiconductor layer, a first doped region, a high-voltage (HV) semiconductor element, and an electrostatic discharge (ESD) protection element. The semiconductor layer has an active region, wherein the active region comprises a first sub-region and a second sub-region. The first doped region is disposed in a portion of the semiconductor layer and extends across the first sub-region and the second sub-region. The high-voltage (HV) semiconductor element is disposed over the semiconductor layer in the first sub-region. The HV semiconductor element comprises a portion of the first doped region formed in the semiconductor layer in the first-sub region of the active region. The electrostatic discharge (ESD) protection element is disposed over the semiconductor layer in the second sub-region. The ESD protection element comprises the other portion of the doped region formed in the semiconductor layer in the second sub-region of the active region.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
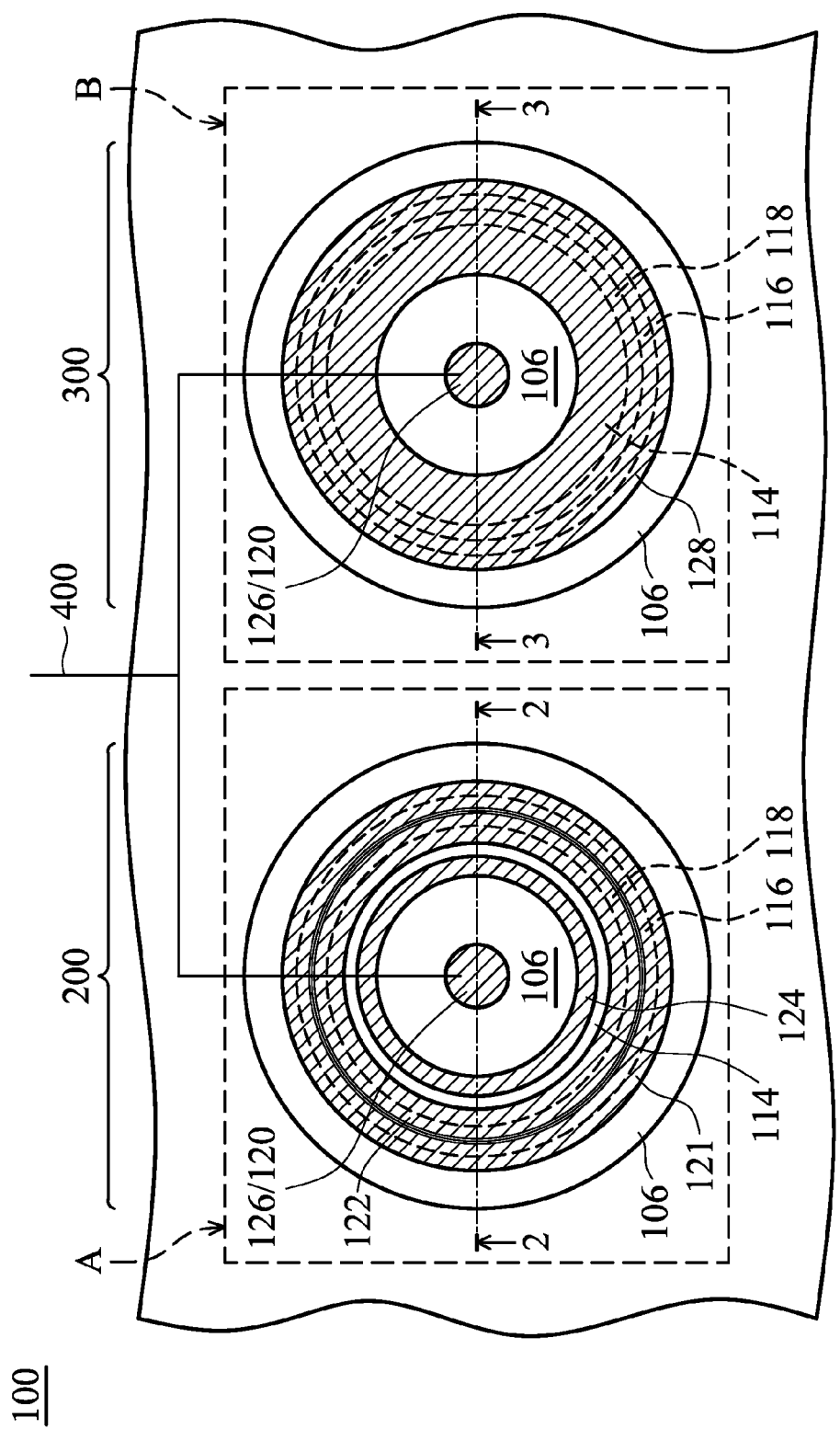
FIG. 1 is a schematic top view showing a semiconductor device according to an embodiment of the invention.

The following description is of the best-contemplated mode of carrying out the invention. This description is made for the purpose of illustrating the general principles of the invention and should not be taken in a limiting sense. The scope of the invention is best determined by reference to the appended claims.

The invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice of the invention.

Figure 2:
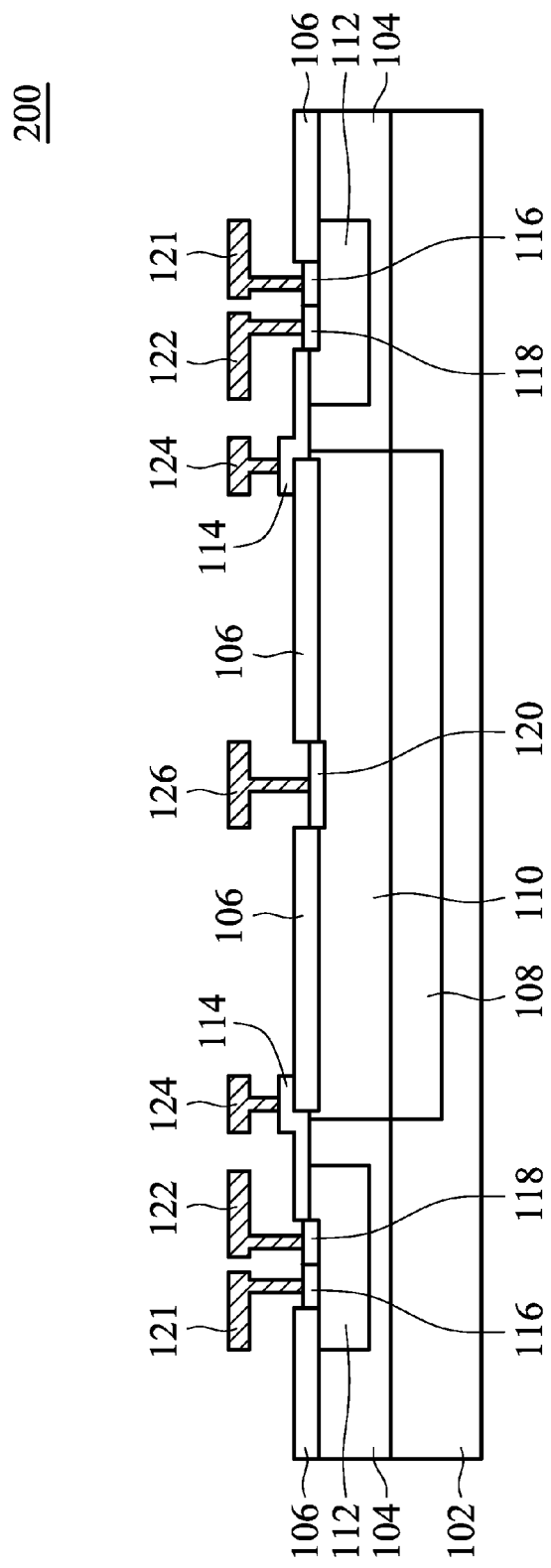
FIG. 2 is a schematic cross-sectional view showing a portion of the semiconductor device along the line 2-2 in FIG. 1.
Figure 3:
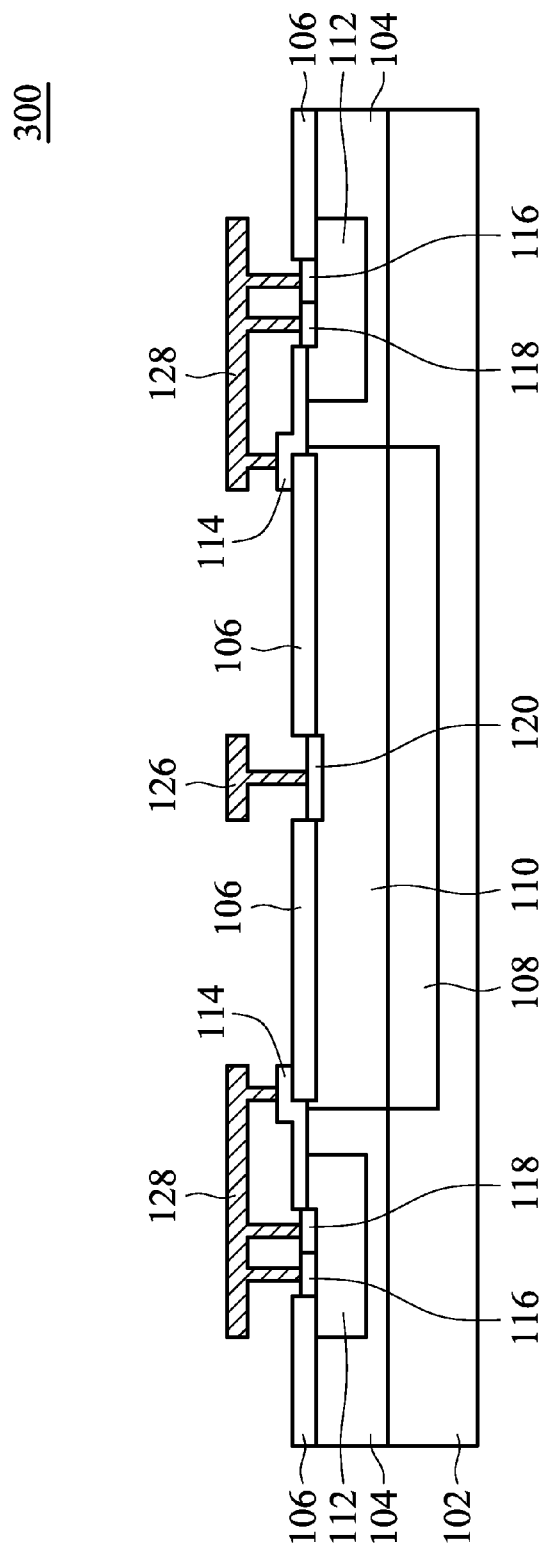
FIG. 3 is a schematic cross-sectional view showing a portion of the semiconductor device along the line 3-3 in FIG. 1.

FIGS. 1-3 are schematic diagrams showing an exemplary semiconductor device 100 suitable for high-voltage applications under an operating voltage greater than, for example, 500 volts. FIG. 1 is a schematic top view showing the semiconductor device 100, and FIGS. 2-3 are schematic cross-sectional views showing cross sections along line 2-2 and line 3-3 in FIG. 1, respectively. Herein, the semiconductor device 100 is used as a comparative embodiment for describing problems related to the size reduction of semiconductor devices comprising an electrostatic discharge protection (ESD) element found by the inventor, but it is not intended to limit the scope of the present application.

In FIG. 1, the semiconductor device 100 comprises a high-voltage (HV) semiconductor element 200 disposed in an active region A over a semiconductor substrate 102, and an electrostatic discharge (ESD) protection element 300 disposed in another active region B over the semiconductor substrate 102. The active regions A and B are separated by an isolation feature (not shown) such as a thick oxide, thereby electrically insulating components in the HV semiconductor element 200 with components in the ESD protection element 300.

As shown in FIG. 1, the HV semiconductor element 200 is illustrated as, for example, a lateral double diffused metal-oxide-semiconductor (LDMOS) transistor, and the ESD protection element 300 is illustrated as, for example, a gate grounded metal-oxide-semiconductor (GGMOS) transistor for example. For the purpose of simplicity, only portions of the gate structure (illustrated as a gate structure 114), the source region (illustrated as a doped region 118), the drain region (illustrated as a doped region 120), the body region (illustrated as a doped region 116), and the conductive features (illustrated as a plurality of conductive features 121, 122, 124, 126) of the HV semiconductor element 200 and the ESD protection element 300 are partially illustrated, and the other components of the HV semiconductor element 200 and the ESD protection element 300 are shown in the schematic cross-sectional views in FIGS. 2-3.

FIG. 2 shows a schematic cross-sectional view of the HV semiconductor element 200 along the line 2-2 in FIG. 1. Herein, as the HV semiconductor element 200 is an LDMOS transistor, it may comprise a semiconductor substrate 102, a semiconductor layer, a plurality of isolation features 106, a well region 108, a pair of body regions 112, a gate structure 114, a pair of doped regions 116 and 118, and a doped region 120. The semiconductor layer 104 is formed over the semiconductor substrate 102, and the plurality of isolation features 106 are formed separately over a portion of a top surface of the semiconductor substrate 102. The well region 108 is formed in a portion of the semiconductor substrate 102 and the pair of body regions 112 are formed in another portion in the semiconductor layer 104 on opposite sides of the well region 110. The gate structure 114 is formed over a portion of the semiconductor layer 104 and the body region 112, and extends over a portion of one of the isolation features 106. The pair of doped regions 116 and 118 are formed in each of the body regions 112, and a doped region 120 formed in the well region 110.

As shown in FIG. 2, the well region 110 is substantially over the well region 108, and the isolation features 106 substantially expose a plurality of portions of a top surface of the semiconductor layer 104. The doped regions 116, 118, and 120 are substantially disposed in the portions of the semiconductor layer 104 exposed by the isolation features 106, and are respectively formed in a portion of the body region 112 and the well region 110.

In one embodiment, the semiconductor layer 104 can be an epitaxial semiconductor layer, and the semiconductor substrate 102 and the semiconductor layer 104 may comprise semiconductor materials such as silicon. The semiconductor substrate 102, the semiconductor layer 104, the body region 112 and the doped region 116 may have a first conductivity type, such as p-type. The well regions 108 and 110, and the doped regions 116 and 118 may have a second conductivity type opposite to the first conductivity type, such as N-type. In one embodiment, the well region 110 functions as a drift region, the doped region 116 functions as a body-contact region, and the doped regions 118 and 120 function as a source region and a drain region, respectively. The doped regions 116, 118, and 120 may have a dopant concentration greater than that of the body region 112 or the well region 110 adjacent thereto. In one embodiment, the gate structure 114 may comprise a gate dielectric layer and a gate electrode layer (both not shown) sequentially stacked over the semiconductor layer 104.

In addition, as shown in FIGS. 1-2, a plurality of separated conductive features 121, 122, 124, and 126 are formed over the semiconductor substrate 102 in the active region A to physically connect the doped region 116, the doped region 118, the gate structure 114, and the doped region 120, respectively. An inter-layer dielectric (ILD) layer (not shown) can be provided between the conductive features 121, 122, 124 and 126, and the semiconductor layer 104, the doped region 116, the doped region 118, the gate structure 114 and the doped region 120, to electrically insulate the conductive features 121, 122, 124, and 126.

FIG. 3 shows a schematic cross-sectional view of the ESD protection element 300 along line 3-3 in FIG. 1. As the ESD protection element 300 functions as the GGMOS transistor, the ESD protection element 300 may have a cross-sectional view similar to that of the LDMOS transistor 200 shown in FIG. 2. Therefore, the ESD protection element 300 may also comprise the semiconductor substrate 102, a semiconductor layer 104, a plurality of isolation features 106, a well region 108, a pair of body regions 112, a gate structure 114, a pair of doped regions 116 and 118, and a doped region 120. The semiconductor layer 104 is formed over the semiconductor substrate 102 and the plurality of isolation features 106 are formed seperately over a top surface of the semiconductor layer 104. The well region 108 is formed in a portion of the semiconductor substrate 102 and the pair of body regions 112 are formed in another portion in the semiconductor layer 104 and on opposite sides of the well region 110, respectively. The gate structure 114 is formed over a portion of the semiconductor layer 104 and the body region 112, and extends over a portion of one of the isolation features 116, and the pair of doped regions 116 and 118 are formed in each of the body regions 112. The doped region 120 formed in the well region 110. The above components are formed in the same way as those components in the HV semiconductor element 200 shown in FIGS. 1-2.

In addition, as shown in FIGS. 1 and 3, two separate conductive features 126 and 128 are formed over the semiconductor substrate 102. Unlike the configurations of the conductive features 121, 122, and 124 shown in FIGS. 1 and 2, the conductive feature 128 shown in FIGS. 1 and 3 simultaneously connects the doped region 116, the doped region 118 and the gate structure 114, and the conductive feature 126 still connects the doped region 120, thereby forming a GGMOS transistor that is different from the LDMOS transistor used as the HV semiconductor element 200 shown in FIG. 2.

As shown in FIGS. 1-3, during the operation of the semiconductor device 100, an external conductive line 400, for example a wire bond, can be provided to electrically connect the conductive feature 126 in the HV semiconductor element 200 and the conductive feature 126 in the ESD protection element 300, respectively, such that the doped region 120 functioning as the drain region in the HV semiconductor element 200 and the doped region 120 functioning as the drain region in the ESD protection element 300 are connected in parallel to make the ESD protection element 300 sustain ESD damage and prevent damage to the HV semiconductor element 200, thereby ensuring the reliability and extending the lifespan of the semiconductor device 100.

However, since the components in the HV semiconductor element 200 and the ESD protection element 300 of the semiconductor device 100 shown in FIGS. 1-3 are formed as a symmetrical configuration to the doped region 120, a greater area is occupied for forming the active regions A and B. As the needs and trends in size reduction in semiconductor fabrication techniques continue, improvements to the semiconductor device 100 shown in FIGS. 1-3 are needed to provide a semiconductor device comprising an ESD protection element with a reduced size which can be used in high-voltage applications.

Figure 4:
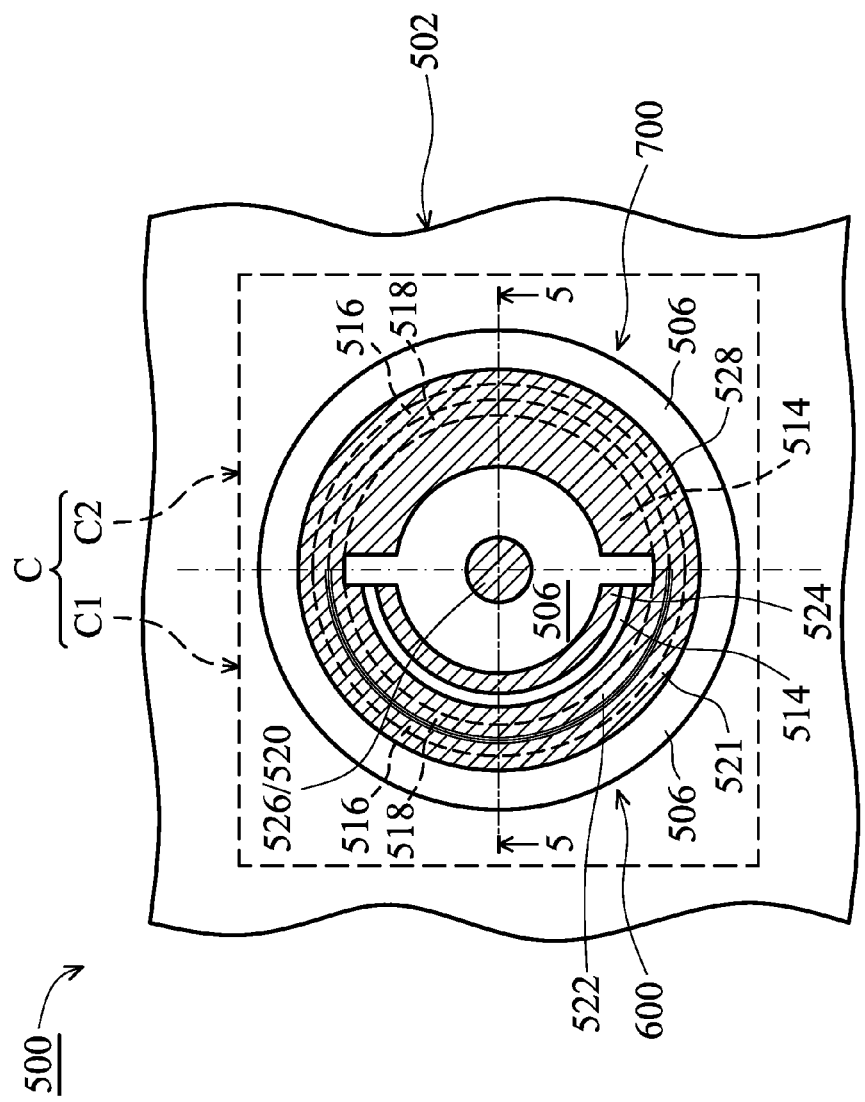
FIG. 4 is a schematic top view showing a semiconductor device according to another embodiment of the invention.
Figure 5:
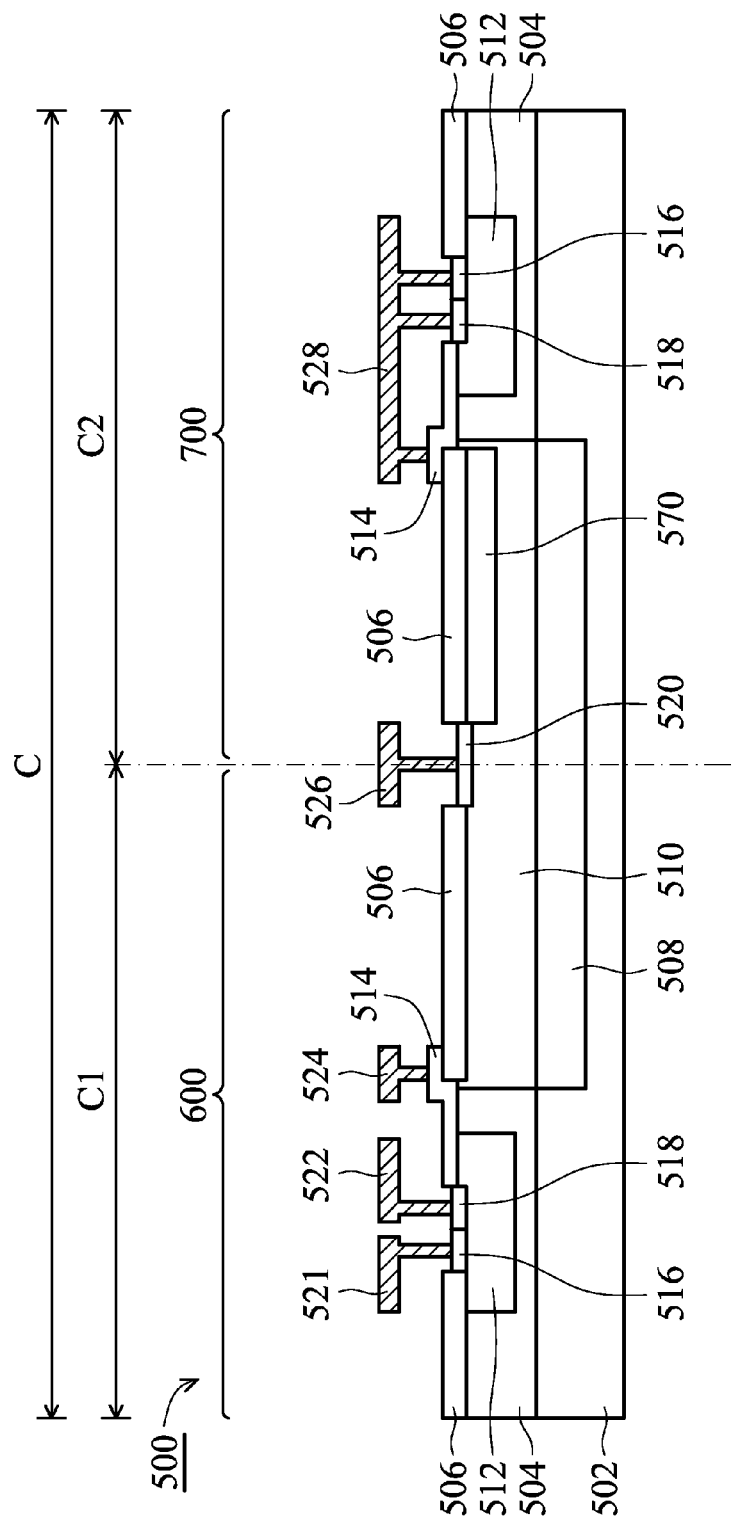
FIG. 5 is a schematic cross-sectional view showing a portion of the semiconductor along the line 5-5 in FIG. 4.

Accordingly, referring to the schematic diagrams shown in FIGS. 4-5, another exemplary semiconductor device 500 suitable for high-voltage operation applications under an operating voltage greater than, for example, 500 volts, is illustrated. When compared with the semiconductor device 100 shown in FIGS. 1-3, the semiconductor device 500 shown in FIGS. 4-5 has a further reduced size, and an ESD protection element is integrated into the semiconductor device 500 to ensure the reliability and the lifetime of the semiconductor device 500. FIG. 4 shows a schematic top view of the semiconductor device 500, and FIG. 5 shows a schematic cross-sectional view of the semiconductor device 500 along line 5-5 in FIG. 4.

In FIG. 4, the semiconductor device 500 comprises a high-voltage (HV) semiconductor element 600 and an electrostatic discharge (ESD) protection element 700 integrated in a single active region C over a semiconductor substrate 502. The active region C is surrounded by an isolation feature (not shown) such as a thick oxide to electrically insulate components in the HV semiconductor element 600 and the ESD protection element 700 from other components (not shown) disposed in the region outside of the active region C. Herein, the active region C comprises two adjacent sub-regions C1 and C2, and the HV semiconductor element 600 is formed over the semiconductor substrate 502 in the sub-region C1, and the ESD protection element 700 is formed over the semiconductor substrate 502 in the sub-region C2.

As shown in FIG. 4, the HV semiconductor element 600 is illustrated as, for example, a lateral double diffused metal-oxide-semiconductor (LDMOS) transistor, and the ESD protection element 700 is illustrated as, for example, a gate grounded metal-oxide-semiconductor (GGMOS) transistor. For the purpose of simplicity, only portions of the gate structure (illustrated as a gate structure 514), the source region (illustrated as a doped region 518), the drain region (illustrated as a doped region 520), the body region (illustrated as a doped region 516), and the conductive features (illustrated as a plurality of conductive features 521, 522, 524, 526, 528) of the HV semiconductor element 600 and the ESD protection element 700 are partially illustrated, and the other components of the HV semiconductor element 600 and the ESD protection element 700 are shown in the schematic cross-sectional views shown in FIG. 5. Herein, the HV semiconductor element 600 and the ESD protection element 700 share a drain region 520, and the body region (see the doped region 512 in FIG. 5), the source region (illustrated as the doped region 518), the body-contact region (illustrated as the doped region 516), and the conductive feature 521 of the HV semiconductor element 600 are connected to the body region (see the doped region 512 in FIG. 5), the source region (illustrated as the doped region 518), the body contact region (illustrated as the doped region 516), and the conductive feature 528 of the ESD protection element 700, such that the above regions and components extend across the sub-regions C1 and C2 and are partially disposed over a portion of the semiconductor substrate 502 in the sub-regions C1 and C2. In addition, the other components such as the gate structure 514 and the conductive features 522 and 524 of the HV semiconductor element 600 are isolated from the components such as the gate structure 514 and the conductive feature 528 of the ESD protection element 700, and no physical contact is formed therebetween.

FIG. 5 shows a schematic cross-sectional view of the semiconductor device 500 along the line 5-5 in FIG. 4. Herein, the semiconductor device 500 integrates the HV semiconductor element 600 and the ESD protection element 700 in the sub-regions C1 and C2 of a single active region C of the semiconductor substrate 502 as a single device. As shown in FIG. 5, as the HV semiconductor element 600 is the LDMOS transistor and the ESD protection element 700 is the GGMOS transistor. The semiconductor device 500 may comprise the semiconductor substrate 502, a semiconductor layer 504, a plurality of isolation features 506, a well region 508, a pair of body regions 512, a gate structure 514, a pair of doped regions 516 and 518, a doped region 520, and a doped region 570. The semiconductor layer 504 is formed over the semiconductor substrate 502 and the plurality of isolation features 506 are formed separately over a portion of a top surface of the semiconductor substrate 502. The well region 508 is formed in a portion of the semiconductor substrate 502 and the pair of body regions 512 are formed in another portion in the semiconductor layer 504 on opposite sides of the well region 510. The gate structure 514 is formed over a portion of the semiconductor layer 504 and the body region 512, and extends over a portion of one of the isolation features 506 and the pair of doped regions 516 and 518 formed in each of the body regions 512. The doped region 520 is formed in the well region 510 and the doped region 570 is formed in a portion of the well region 510 in the sub-region C1 of the active region C, being adjacent to a doped region 570 under the isolation feature 506 adjacent to the doped region 520.

As shown in FIG. 5, the well region 510 is substantially over the well region 508, and the isolation features 506 substantially expose a plurality of portions of the top surface of the semiconductor layer 504, and the doped regions 516, 518, and 520 are substantially disposed in these portions of the semiconductor layer 504 exposed by the isolation features 506, and are respectively formed in a portion of the body region 512 and the well region 510.

In one embodiment, the semiconductor layer 504 can be an epitaxial semiconductor layer, and the semiconductor substrate 502 and the semiconductor layer 504 may comprise semiconductor materials such as silicon. The semiconductor substrate 502, the semiconductor layer 504, the body region 512 and the doped region 516 may have a first conductivity type, such as P-type, and the well regions 508 and 510, and the doped regions 516, 518, and 570 may have a second conductivity type opposite to the first conductivity type, such as N-type. In one embodiment, the well region 510 functions as a drift region, the doped region 516 functions as a body contact region. The doped regions 518 and 520 function as a source region and a drain region, respectively. The doped regions 516, 518, 520 and 570 may have a dopant concentration greater than that of the body region 512 or the well region 510 adjacent thereto. In one embodiment, the gate structure 514 may comprise a gate dielectric layer and a gate electrode layer (both not shown) sequentially stacked over the semiconductor layer 504.

In addition, as shown in FIGS. 4-5, a plurality of separate conductive features 521, 522, 524, and 526 are formed over the semiconductor substrate 502 in the sub-region C1 of the active region C to physically connect the doped region 516, the doped region 518, the gate structure 514, and the doped region 520 in the sub-region C1. An inter-layer dielectric (ILD) layer (not shown) can be further provided between the conductive elements 521, 522, 524 and 526, and the semiconductor layer 504, the doped region 516, the doped region 518, the gate structure 514 and the doped region 520 to electrically insulate the conductive elements 521, 522, 524, and 526.

In addition, as shown in FIGS. 4 and 5, two separate conductive features 526 and 528 are formed over the semiconductor substrate 502 in the sub-region C2 of the active region C. Unlike the configurations of the conductive features 521, 522, and 524 in the sub-region C1 of the active region C, the conductive feature 528 in the sub-region C2 of the active region C simultaneously connects the doped region 516, the doped region 518 and the gate structure 514, and the conductive feature 526 still connects the doped region 520, thereby forming the GGMOS transistor different from the LDMOS transistor used as the HV semiconductor element 600.

As shown in FIGS. 4-5, during operation of the semiconductor device 500, the use of the external conductive line 400, for example a wire bond, for electrically connecting the conductive feature 126 in the HV semiconductor element 200 and the conductive feature 126 in the ESD protection element 300 as shown in FIG. 1 is prevented, and the HV semiconductor element 600 and the ESD protection element 700 are electrically connected by directing connecting the doped region 520 in the semiconductor device 500. Due to formation of the doped region 570 adjacent to the doped region 520 formed in a portion of the well region 510 (i.e. the drift region), a breakdown voltage of the ESD protection element 700 is reduced to a level that is less than that of the HV semiconductor semiconductor element 600. Therefore, once electrostatic discharge happens in the semiconductor device 500, the ESD protection element 700 in the sub-region C2 of the active region C sustains damage caused by the ESD, thereby preventing damage to the HV semiconductor element 600 in the sub-region C1 of the active region C and ensuring the reliability and extending the lifespan of the semiconductor device 500.

Moreover, since the semiconductor device 500 integrates the HV semiconductor element 600 and the ESD protection element 700 in a single active region, the semiconductor device 500 occupies an area of the semiconductror substrate that is less than that of the semiconductor device 100 shown in FIGS. 1-3. Thus, a reliable semiconductor device comprising an ESD protection element with a reduced size can be provided as the needs and trends in size reduction of semiconductor fabrication techniques continue.

The exemplary semiconductor device having the ESD protection element is not limited by the configurations shown in FIGS. 4-5. In other embodiments, from the top view, the configuration of the active region C is not limited to the cicular shape shown in FIGS. 4-5, and can be a symmetrical configuration having a polygonal shape or oval shape. In addition, the HV semiconductor element 600 and the ESD protection element 700 are not limited by the LDMOS transistor and the GGMOS transistor shown in FIGS. 4-5, and can be other suitable HV semiconductor elements and ESD protection elements. In one embodiment, the HV semiconductor element 600 can be an insulated gate bipolar transistor (IGBT), and the ESD protection element can be elements such as a diode or a silicon controlled rectifier (SCR).

Figure 6:
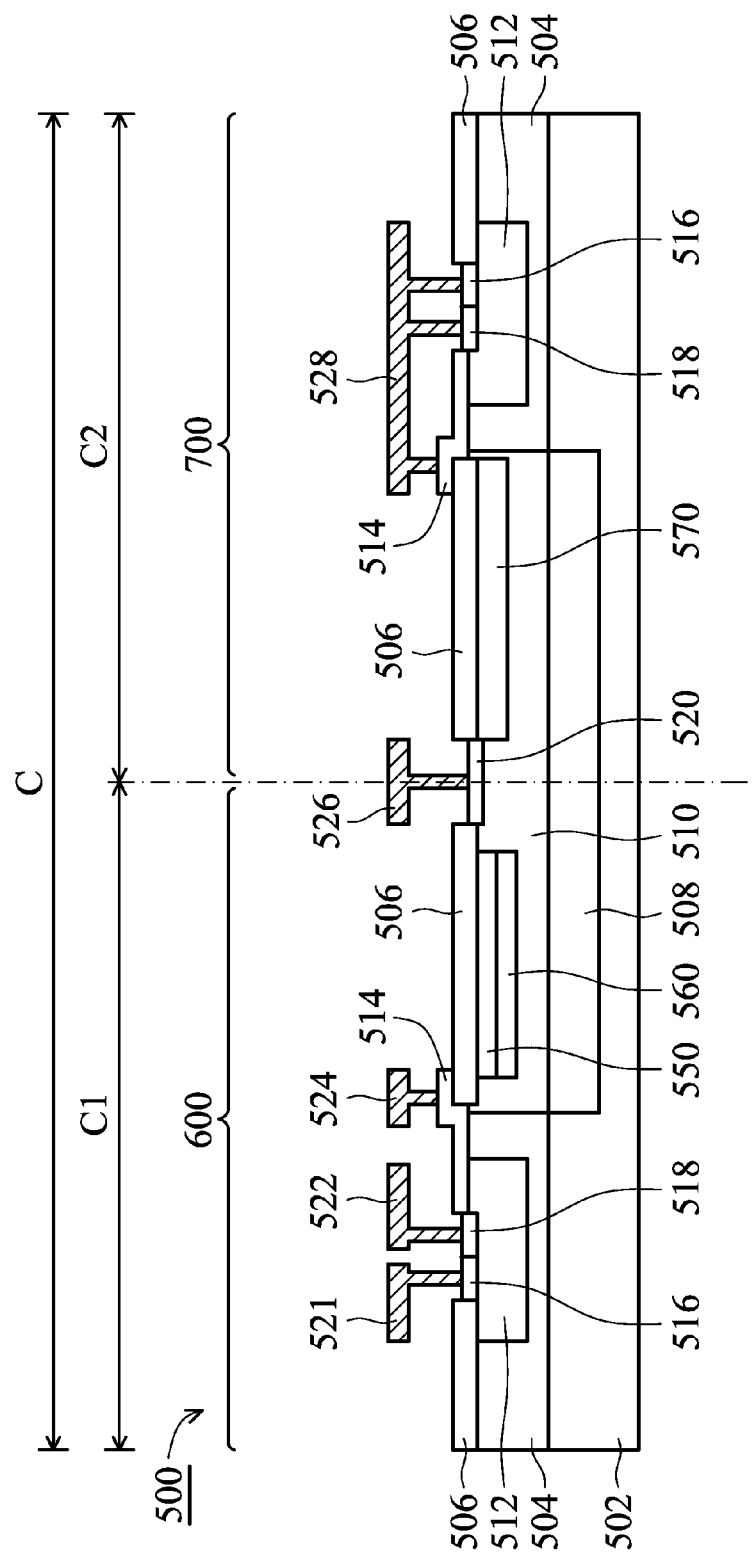
FIG. 6 is another schematic cross-sectional view showing showing a portion of the semiconductor along the line 5-5 in FIG. 4.

FIG. 6 shows a schematic cross-sectional view showing a cross section of the semiconductor device 500 along the line 5-5 in FIG. 4 according to another embodiment of the invention. Herein, the semiconductor device 500 shown in FIG. 6 is modified from the HV semiconductor element 600 of the semiconductor device 500 shown in FIG. 5, and only the differences therebetween are discussed below. As shown in FIG. 6, doped regions 550 and 560 are further formed from top to bottom in the well region 510 and are adjacent to the surface of the isolation feature 506 of the HV semiconductor element 600. The doped region 550 has the second conductivity type that is the same as that of the well region. The doped region 560 has the first conductivity type that is the same as that of the semiconductor substrate 502 and the semiconductor layer 504. In this embodiment, due to the formation of the doped regions 550 and 560, the breakdown voltage of the HV semiconductor element 600 can be increased and the on-state resistance (Ron) of the semiconductor device 500 can be reduced, thereby allowing further reduction of the size and occupied area of the semiconductor device 500.

Figure 7:
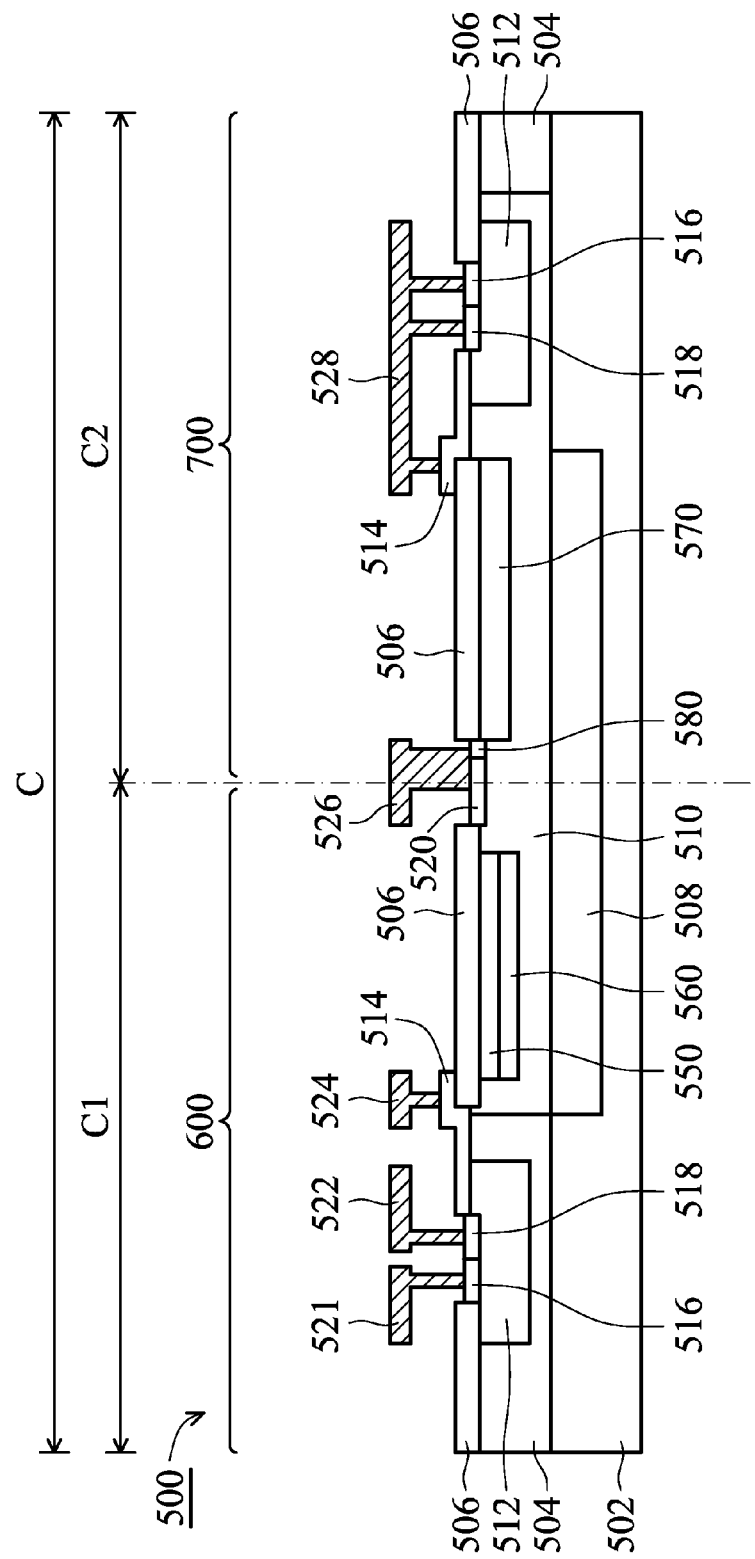
FIG. 7 is a schematic cross-sectional view showing a semiconductor device according to yet another embodiment of the invention.

FIG. 7 is a schematic perspective view of a semiconductor device 500 along line 5-5 in FIG. 4 according to yet another embodiment of the invention. Herein, the semiconductor device 500 shown in FIG. 6 is modified from the ESD protection element 700 of the semiconductor device 500 shown in FIG. 5, and only differences therebetween are discussed below. As shown in FIG. 7, the well region 510 of the ESD protection element 700 further laterally extends to enclose the body region 512 in the sub-region C2, and a doped region 580 is further formed in a portion of the doped region 520 adjacent to a portion of the isolation element 506 in the sub-region C2 to replace the portion of the doped region 520, and the conductive feature 526 still connects the doped region 520 and the doped region 580. The doped region 580 has the first conductivity type opposite to that of the well region 510, and has a dopant concentration that is greater than that of the well region 510. In this embodiment, due to modification of the configuration of the well region 510 in the sub-region C2 and formation of the additional doped region 580, the GGMOS transistor used in the sub-region C2 in FIG. 6 is now replaced by a silicon controlled rectifier (SCR) element.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
    a semiconductor layer having an active region, wherein the active region comprises a first sub-region and a second sub-region;
    a first doped region disposed in a first portion of the semiconductor layer, extending across the first sub-region and the second sub-region;
    a high-voltage (HV) semiconductor element disposed over the semiconductor layer in the first sub-region, wherein the HV semiconductor element comprises a portion of the first doped region formed in the semiconductor layer in the first-sub region of the active region; and
    an electrostatic discharge (ESD) protection element disposed over the semiconductor layer in the second sub-region,
    wherein the ESD protection element comprises the other portion of the first doped region formed in the semiconductor layer in the second-sub region of the active region, a second doped region disposed in a second portion of the semiconductor layer, a gate structure disposed over a third portion of the semiconductor layer, and a first conductive feature disposed over the second doped region and the gate structure, connecting the second doped region and the gate structure.

2. The semiconductor device as claimed in claim 1, wherein the HV semiconductor element is a lateral double-diffused metal-oxide-semiconductor (LDMOS) transistor or an insulated gate bipolar transistor (IGBT).

3. The semiconductor device as claimed in claim 1, wherein the ESD protection element is a gate grounded metal-oxide-semiconductor (GGMOS) transistor, a silicon controlled rectifier (SCR) or a diode.

4. The semiconductor device as claimed in claim 2, wherein the HV semiconductor is the LDMOS transistor, comprising:
    a well region disposed in a portion of the semiconductor layer, wherein the first doped region is disposed in a portion of the well region;
    a body region disposed in a portion of the semiconductor layer;
    a second doped region disposed in a portion of the semiconductor layer;
    an isolation feature disposed over a portion of a top surface of the well region;
    a gate structure disposed over the body region, the well region and a portion of the semiconductor layer and the isolation feature between the well region and the body region; and
    a plurality of conductive features seperately disposed over the first doped region, the second doped region, and the gate structure, respectively connecting the first doped region, the second doped region, and the gate structure, wherein the semiconductor layer and the body region have a first conductivity type, and the first doped region, the second doped region, and the well region have a second conductivity type opposite to the first conductivity type.

5. The semiconductor device as claimed in claim 4, wherein the first conductivity type is P-type, and the second conductivity type is N-type.

6. The semiconductor device as claimed in claim 3, wherein the ESD protection element is the gate grounded metal-oxide-semiconductor (GGMOS) transistor, comprising:
 a well region disposed in a portion of the semiconductor layer, wherein the first doped region is disposed in a portion of the well region;
 a body region disposed in a portion of the semiconductor layer, wherein the-second doped region is disposed in a portion of the body region;
 a third doped region disposed in a portion of the well region, being adjacent to the first doped region;
 an isolation feature disposed in a portion of a top surface of the well region, wherein the gate structure is disposed over the body region, the well region and the third portion of the semiconductor layer and the isolation feature between the well region and the body region;
 a second conductive feature disposed over the first doped region in the well region, connecting the first doped region in the well region;
 wherein the semiconductor layer and the body region have a first conductivity type, and the first doped region, the second doped region, the third doped region, and the well region have a second conductivity type opposite to the first conductivity type.

7. The semiconductor device as claimed in claim 6, wherein the first conductivity type is P-type, and the second conductivity type is N-type.

8. The semiconductor device as claimed in claim 3, wherein the ESD protection element is the SCR, comprising:
 a well region disposed in a portion of the semiconductor layer, wherein the first doped region is disposed in a portion of the well region;
 a body region disposed in a portion of the well region, wherein the second doped region is disposed in a portion of the body region;
 an isolation feature disposed in a portion of a top surface of the well region, wherein the gate structure is disposed over the body region, the well region and the third portion of the semiconductor layer between the well region and the isolation feature;
 a third doped region disposed in a portion of the well region, being adjacent to the first doped region and the isolation element;
 wherein the semiconductor layer, the body region, and the third doped region have a first conductivity type, and the first doped region, the second doped region, and the well region have a second conductivity type opposite to the first conductivity type.

9. The semiconductor device as claimed in claim 8, wherein the first conductivity type is P-type, and the second conductivity type is N-type.

10. The semiconductor device as claimed in claim 1, wherein the active region has a circular, oval or polygonal configuration from a top view.

11. The semiconductor device as claimed in claim 1, wherein the first sub-region is adjacent to the second sub-region.

12. The semiconductor device as claimed in claim 1, wherein the first sub-region and the second sub-region have symmetrical configurations from a top view.

* * * * *